United States Patent
Huang

[11] Patent Number: 6,005,447
[45] Date of Patent: Dec. 21, 1999

[54] METHOD AND DEVICE FOR ADJUSTING THE FREQUENCY OF OSCILLATOR BUILT IN AN INTEGRATED CIRCUIT

[75] Inventor: M. Y. Huang, Taipei Hsien, Taiwan

[73] Assignee: Princeton Technology Corp., Taipei Hsien, Taiwan

[21] Appl. No.: 09/054,501

[22] Filed: Apr. 3, 1998

[51] Int. Cl.[6] ............................................. H03K 3/0231
[52] U.S. Cl. ........................... 331/44; 331/111; 331/143; 331/179
[58] Field of Search .............................. 331/44, 111, 143, 331/179

[56] References Cited

U.S. PATENT DOCUMENTS 5,070,311  12/1991  Nicolai ..................................... 331/111
5,182,528  1/1993  Zuta ......................................... 331/179

Primary Examiner—Siegfried H. Grimm
Attorney, Agent, or Firm—McDermott, Will & Emery

[57] ABSTRACT

An integrated RC oscillator circuit includes a reference voltage generator, a fine tuner, a charging/discharging oscillator, a frequency counter, and a comparator. The reference voltage generator generates stable reference voltages Vref, Vref 1 to Vref 31, 3/4Vref and 1/2Vref. The fine tuner receives as inputs a reset signal, Vref and Vref 1 to Vref 31 and outputs a reference voltage PVref (0<P<1). The charging/discharging oscillator receives as inputs an enable signal, PVref, Vref, 3/4Vref and 1/2Vref and outputs a square wave signal whose frequency is determined by a resistor, a capacitor and the value of P. The frequency counter receives as inputs the reset signal, a timing reference clock and the square wave signal, it counts the frequency of the square wave signal and outputs the frequency value, and it also outputs a PROGRAM signal to the fine tuner. The comparator is a ROM having a table to compare the frequency value from the frequency counter with a preset value to generate a relative value FUSE(0–4) which is supplied to the fine tuner. FUSE(0–4) causes related fuses to be burned out in the fine tuner, so that the fine tuner will generate a new P value, and the oscillator will therefore obtain an accurate frequency.

17 Claims, 7 Drawing Sheets

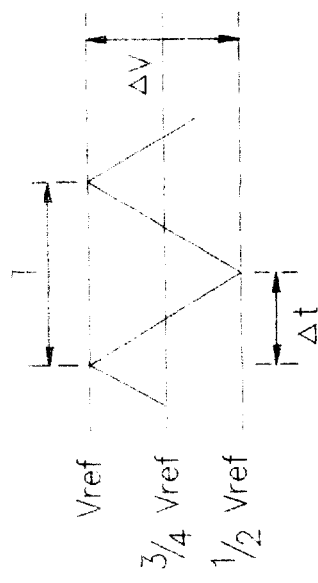
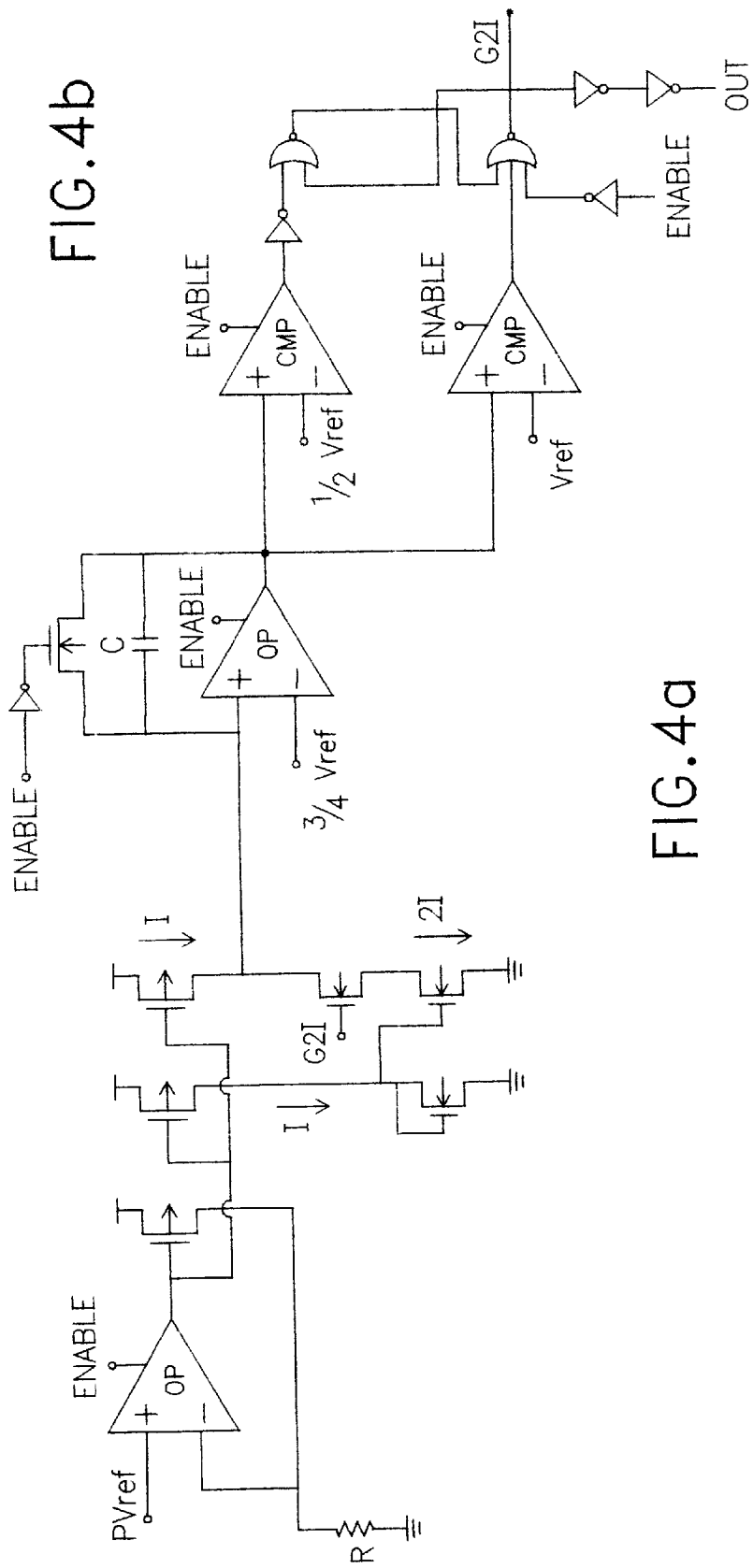
FIG.4b
FIG.4a

METHOD AND DEVICE FOR ADJUSTING THE FREQUENCY OF OSCILLATOR BUILT IN AN INTEGRATED CIRCUIT

FIELD OF THE INVENTION

The present invention relates to a method and device for adjusting frequency, and more particularly to a method and device for adjusting accurately the frequency of oscillator built in an integrated circuit.

BACKGROUND OF THE INVENTION

As an example, in the application of infrared transmitter IC, it generally needs a crystal (or resonator) for providing an accurate frequency to the IC circuit. Said crystal will be parallel connected with two pins of the infrared transmitter IC, and then both will be disposed on a circuit board. However, since the crystal occupies too much space, and the pin number of the IC can not be reduced, the infrared transmitter can not be further miniaturized.

Therefore, the present invention provides a new circuit form by putting an oscillating circuit into IC, so as to save the crystal space on the circuit board. Because of the progressing of IC technologies, an added oscillating circuit in an IC will not increase too much volume of the IC.

However, when an oscillating circuit is built in IC, the frequency accuracy thereof is very difficult to control, and solving this problem is therefore a major object of the present invention.

Furthermore, the internal power supply of a remote control circuit, e.g. a battery, will generally decrease with time; and transient current happened during turning on the output driving device (e.g. NPN BJT) will also produce too much noise, both will influence the oscillating frequency. These problems are also the targets of the present invention.

OBJECTS OF THE INVENTION

It is therefore an object of the present invention to provide an oscillator built in an integrated circuit, so as to save the pin number of IC and save the layout area of the resonator on board, and the related circuit board can be miniaturized.

It is another object of the present invention to provide a method and device for adjusting accurately and briefly the frequency of oscillator built in an integrated circuit.

It is a further object of the present invention to provide a method and device for adjusting the frequency of oscillator built in an integrated circuit, so as to avoid the drift of the oscillating frequency due to power decreasing (e.g. a battery), and to avoid the variation of oscillating frequency due to transient current.

BRIEF DESCRIPTION OF THE DRAWINGS

The present invention can be better understood by detailed description of the following drawings, in which:

FIG. 4(a) is a circuit diagram of a charging/discharging oscillator 3.

FIG. 4(b) is a charging/discharging waveform of a resistor R and a capacitor C in the oscillator 3.

DETAILED DESCRIPTION OF THE INVENTION

Figure 1:
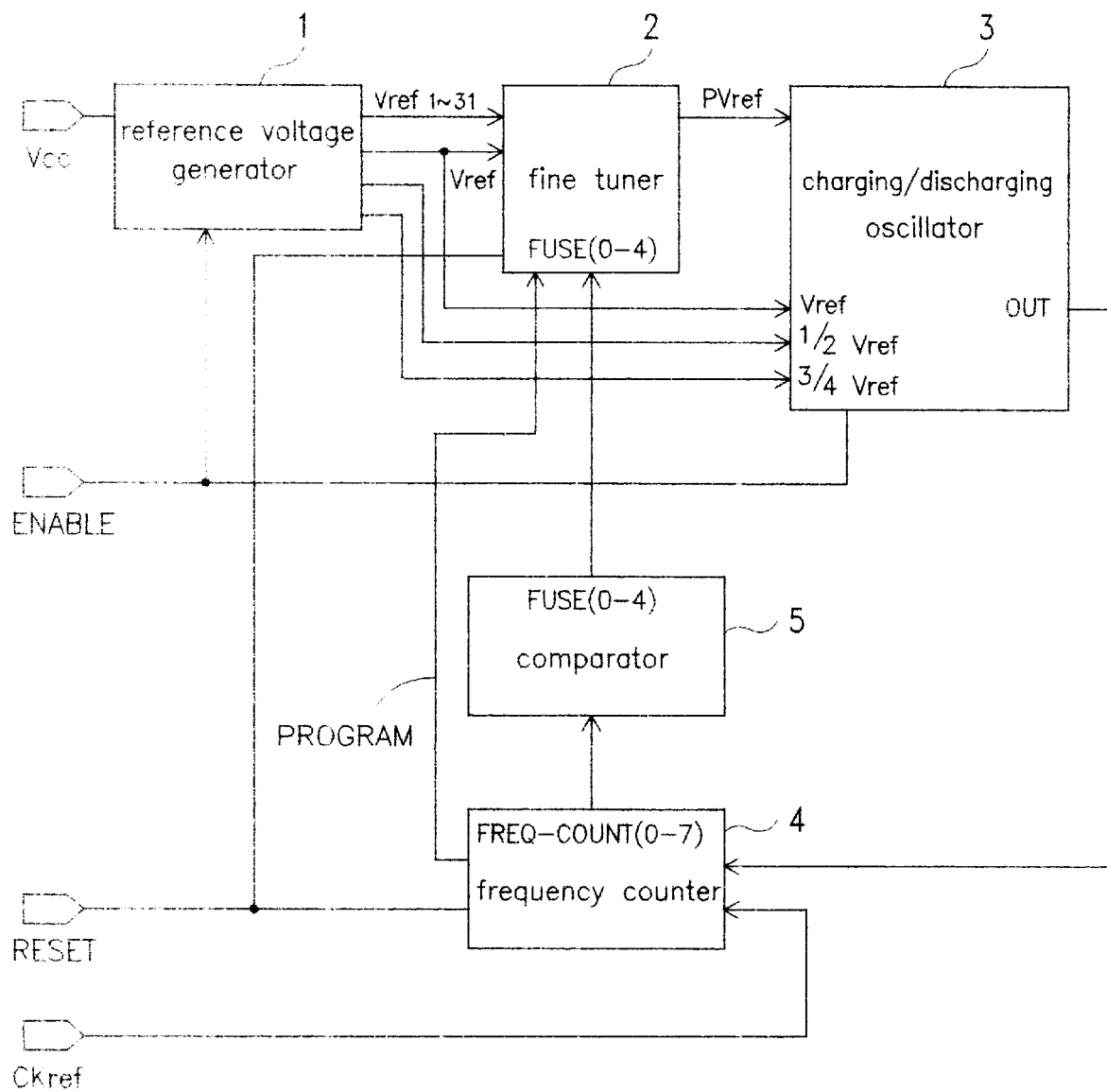
FIG. 1 is a system block diagram of the present invention showing a device for adjusting the frequency of oscillator built in an integrated circuit.

Referring to FIG. 1, which is a system block diagram of the present invention showing a device for adjusting the frequency of oscillator built in an integrated circuit, comprising an enable signal ENABLE, a reset signal RESET, a timing reference clock CKref, and several circuits as below:

a reference voltage generator 1 for power regulation: A power source Vcc will pass through the reference voltage generator 1 for outputting stable reference voltages Vref, Vref 1~Vref 31, 3/4Vref, 1/2Vref;

a fine tuner 2: Reset signal RESET, Vref, Vref 1~Vref 31 will be inputted into fine tuner 2 for outputting PVref (0<P<1);

a charging/discharging oscillator 3: which will be inputted with ENABLE, PVref, Vref, 3/4Vref, 1/2Vref and output a square wave OUT. A resistor R and a capacitor C in oscillator 3 for charge/discharge 3 can control the coarse frequency of OUT. The frequency of OUT will be fine tuned to get an accurate frequency and will be described later;

a frequency counter 4: which will accept RESET, CKref, OUT, and count the frequency of OUT, and then output the counted frequency value, and output a PROGRAM signal to fine tuner 2;

a comparator 5: which is a ROM having a table to compare the frequency value from frequency counter 4 with a presetted value, so as to get a relative value FUSE(0–4) to be outputted to fine tuner 2.

Fine tuner 2 will adjust an accurate frequency according to FUSE(0–4) and PROGRAM signal.

The details of the above circuits will be described respectively as below.

Figure 2:
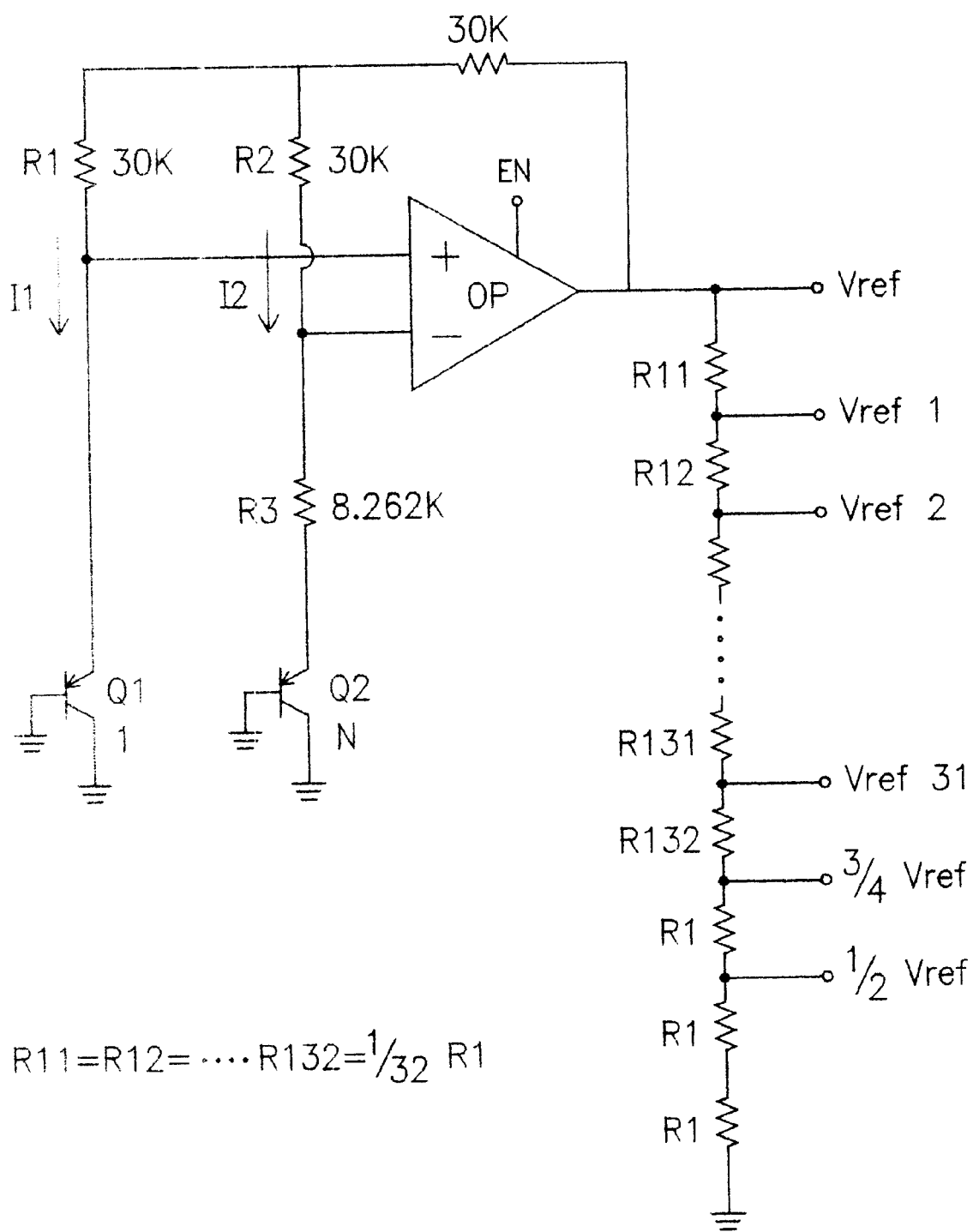
FIG. 2 is a circuit diagram of a reference voltage generator 1 of the present invention.

Referring to FIG. 2, which is a circuit diagram of the reference voltage generator 1 of the present invention, and is designed to be a type of Band Gap Voltage Reference, wherein the device ratio between Q1 and Q2 is 1:N. If current I2=10 μA, N=24, and the voltage Veb between emitter and base of Q1 is 0.7 volt, then the output Vref of amplifier OPR will be 1.6 volt. Vref will then be divided into 1/2Vref, 3/4Vref, and Vref 1~Vref 31 by three resistors R1 and resistors R11, R12, R13, . . . R131, R132, wherein R11=R12=R13= . . . =R131=R132=R1×1/32.

Figure 3A:
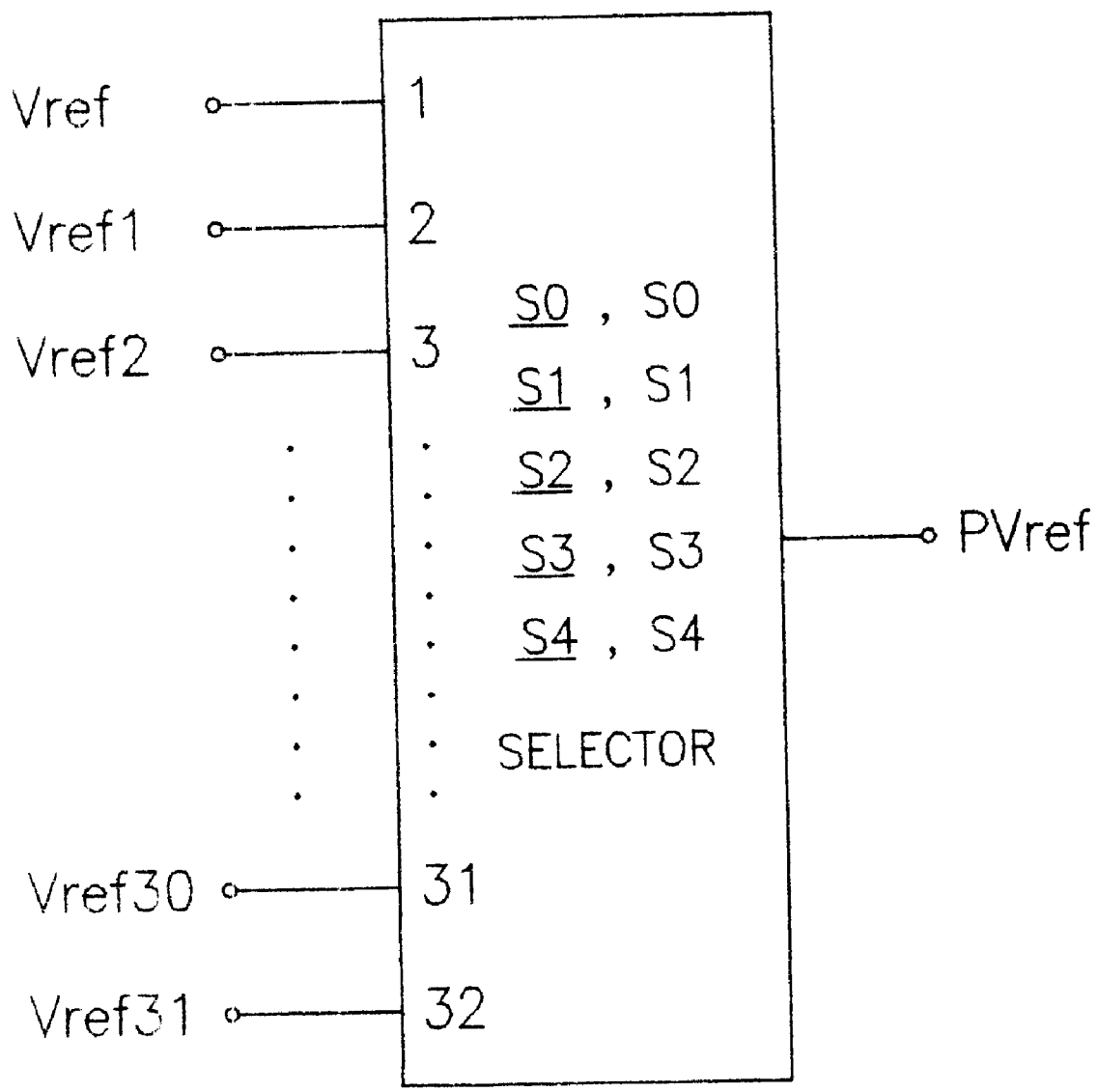
FIG. 3(a) is a schematic connection diagram of a SELECTOR in a fine tuner 2.
Figure 3B:
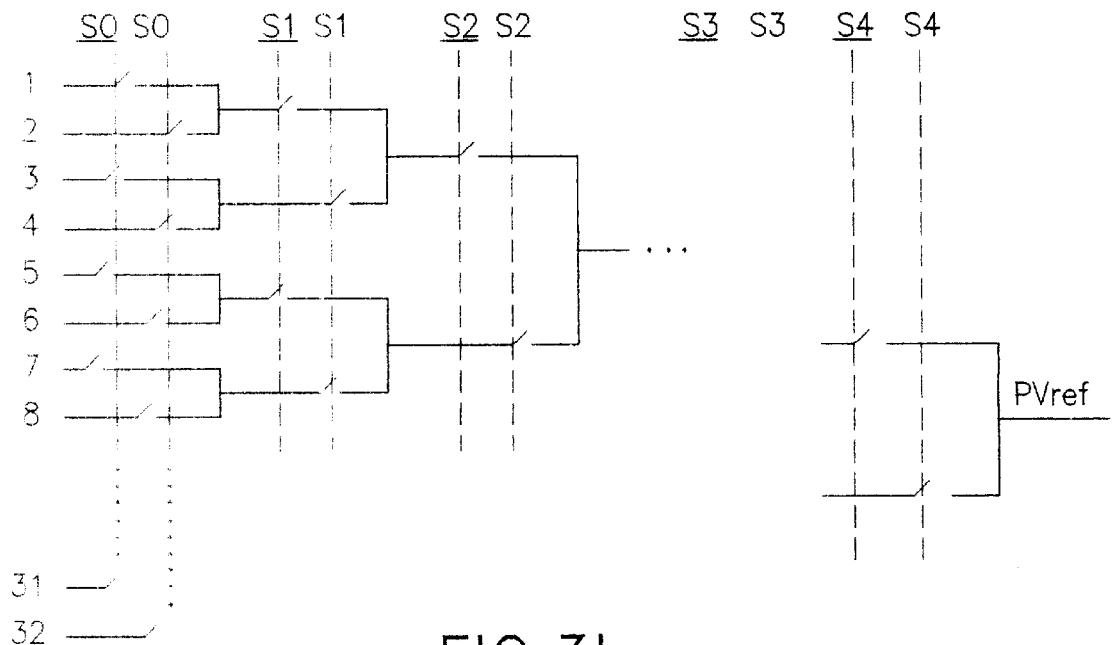
FIG. 3(b) is a schematic diagram showing the SELECTOR in the fine tuner 2.
Figure 3C:
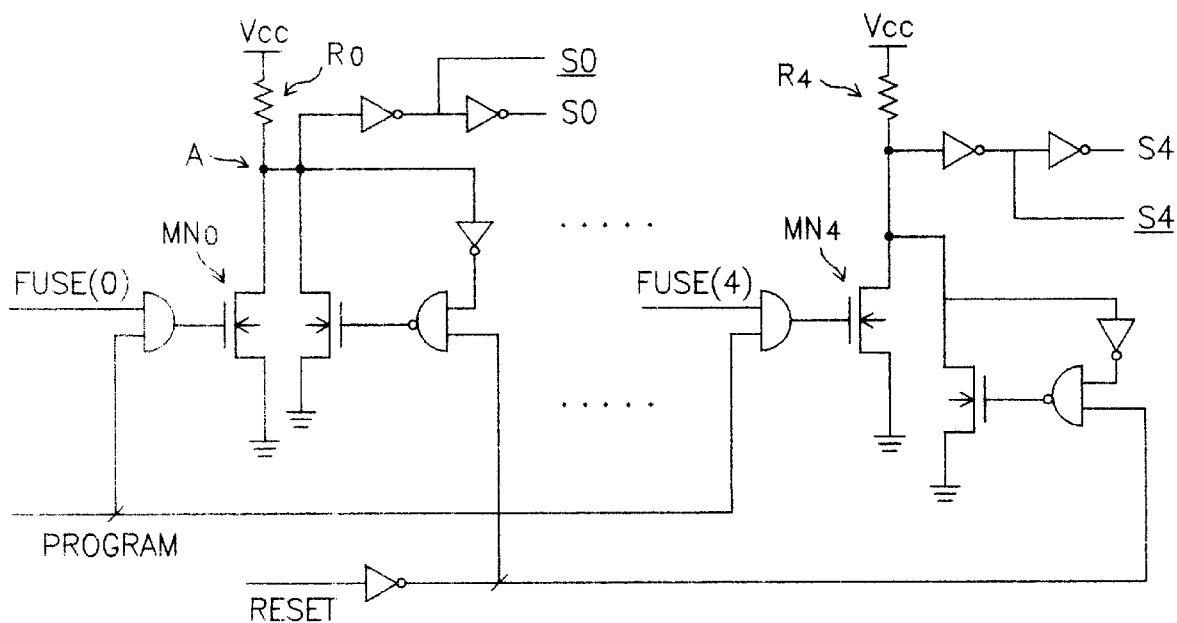
FIG. 3(c) is a fuse programming circuit of the fine tuner 2.

Referring to FIG. 3, which is the circuit diagram of the fine tuner 2. Fine tuner 2 comprises a SELECTOR shown in FIG. 3(a) and a fuse programming circuit shown in FIG. 3(c), wherein the SELECTOR is a one-out-of-32 switch, as shown in FIG. 3(b).

Referring to FIG. 3(b), which is a 5-bit switch, so there are 32 types of switching state. The states (0 or 1) of S0, S̲0̲, S1, S̲1̲, S2, S̲2̲, S3, S̲3̲, S4, S̲4̲ will be determined by the fuse programming circuit in FIG. 3(c). As shown in FIG. 3(c), FUSE(0) and PROGRAM signals will decide whether MN0 is conducting. As MN0 is conducting, R0 will be burned to open (R0 is a slim poly fuse, and will be described later), so the state of A point will be 0, S0=1, S0=0; and as MN0 is off, S0=0, S0=1. Therefore, the states (0 or 1) of S0, S0, S1, S1, S2, S2, S3, S3, S4, S4 can be determined by FUSE(0), FUSE(1), . . . FUSE(4) and PROGRAM, so as to select one path out of 32 possibilities in SELECTOR, thus PVref is determined. For example, if the 20$^{th}$ path is conducting, P=0.75+0.25(12/32)=0.84375.

Referring to FIG. 4(a), which is a circuit diagram of charging/discharging oscillator 3, having a resistor R and a capacitor C for charging/discharging. ENABLE signal, PVref of the fine tuner 2, and Vref, 1/2Vref, 3/4Vref of the reference voltage generator 1 are inputted to generate a square wave OUT. Resistor R and capacitor C are used to control the frequency of square wave OUT. FIG. 4(b) shows the charging/discharging waveform of resistor R and capacitor C, having a period of T. In FIG. 4(a), current I=PVref/R, I×Δt/C=ΔV, T=2Δt=2×CΔV/I; and in FIG. 4(b), ΔV=(1/2)Vref, so T=RC/P. Since RC is a constant, and P can be adjusted to an ideal value, T can therefore be also adjusted to an ideal value, and so does the frequency. Thus a desired frequency can be obtained by adjusting the value of P.

Figure 5A:
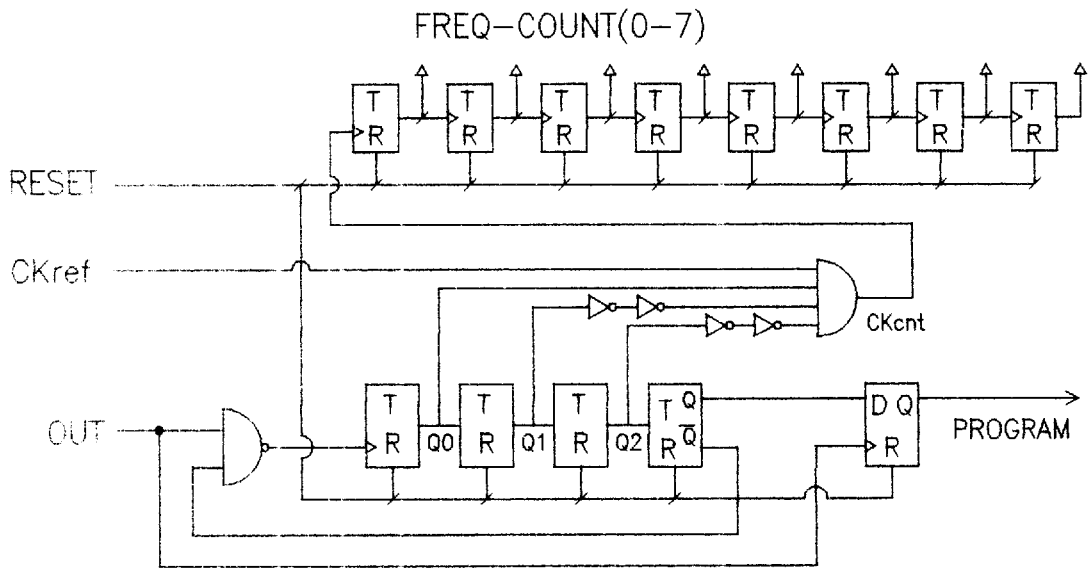
FIG. 5(a) is a circuit diagram of a frequency counter 4.
Figure 5B:
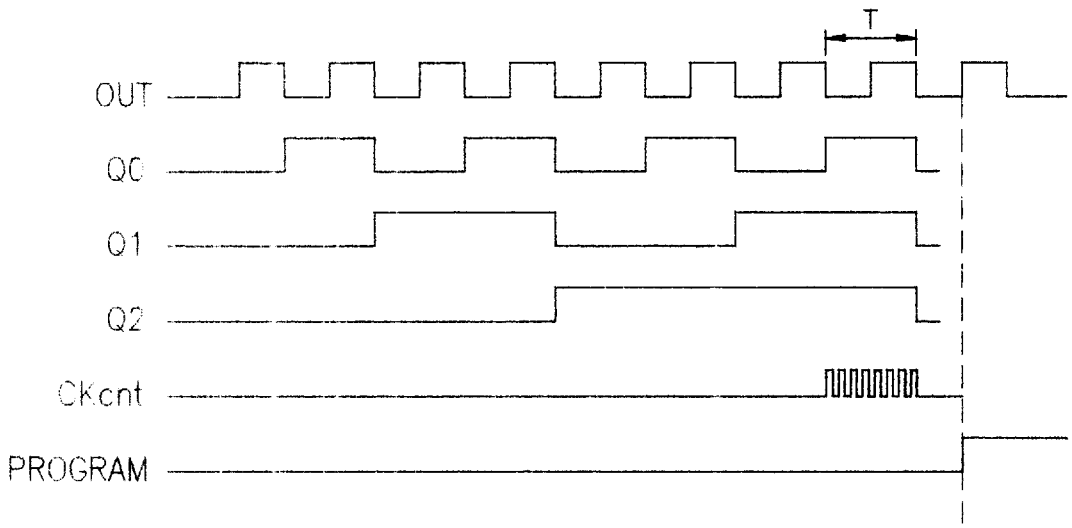
FIG. 5(b) is a timing chart showing the waveforms of OUT, Q0, Q1, Q2, CKcnt, PROGRAM in frequency counter 4.
Figure 5C:
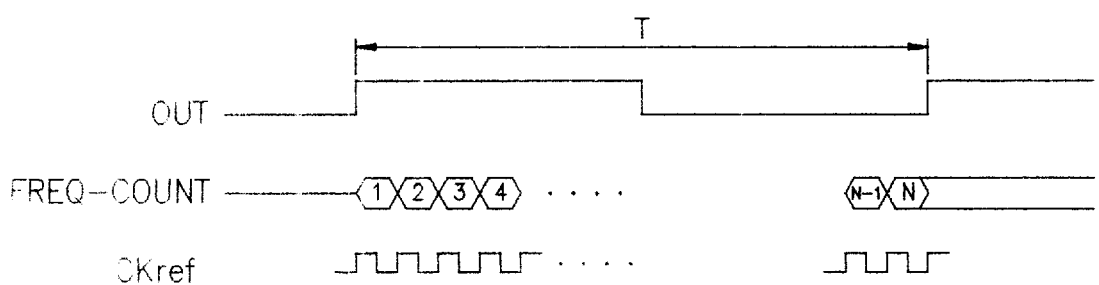
FIG. 5(c) shows the period T of OUT, the timing chart of FREQ-COUNT and CKref.

Referring to FIG. 5(a), which is a circuit diagram of the frequency counter 4, comprising four T type flip flops, one D type flip flop, and another eight T type flip flops. RESET signal, timing reference clock CKref, and square wave OUT from oscillator 3 are input signals. FIG. 5(b) shows the timing chart of OUT, Q0, Q1, Q2, CKcnt, PROGRAM. FIG. 5(c) shows the period T of OUT. By counting CKref, the period T of OUT is calculated as N periods of CKref.

Since the frequency of CKref is a predetermined known frequency, the frequency of OUT is therefore obtained as an 8-bit digital form of FREQ-COUNT(0–7), and sent to comparator 5. Comparator 5 will generate a value of FUSE(0–4) to be outputted to fine tuner 2.

In order to let the sync-error between CKref and OUT less than 1/200(=0.5%), the bit width of FREQ-COUNT should be 8 bit (since $2^8$=256>200). The wider the bit width is, the more accurate the sync-error is.

Figure 6:
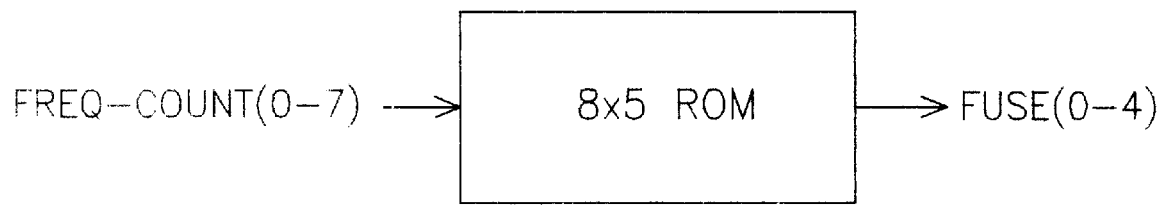
FIG. 6 is the schematic diagram of a comparator (a ROM table for comparison).

Referring to FIG. 6, which is the schematic diagram of the comparator 5. Comparator 5 is an 8×5 ROM having an internal table. FREQ-COUNT(0–7) from frequency counter 4 will be compared with presetted values in the table, and a relative value FUSE(0–4) of 5-bit will be obtained to be outputted to the fine tuner 2.

The above FREQ-COUNT(0–7) comprises FREQ-COUNT(0), FREQ-COUNT(1), FREQ-COUNT(2), FREQ-COUNT(3), FREQ-COUNT(4), FREQ-COUNT(5), FREQ-COUNT(6), FREQ-COUNT(7); and FUSE(0–4) comprises FUSE(0), FUSE(1), FUSE(2), FUSE(3), FUSE(4).

Fine tuner 2 will generate a P value according to FUSE (0–4) and PROGRAM signals, thus an accurate frequency is obtained.

The initial frequency of the present invention will depend upon the resistor R and the capacitor C in oscillator 3, which is just the frequency of the square wave OUT from oscillator 3, and is not very accurate, so the frequency counter 4 will count the initial frequency and calculate the frequency difference, then output PROGRAM signal to fine tuner 2 and output FREQ-COUNT(0–7) to comparator 5. Comparator 5 will compare FREQ-COUNT(0–7) with a presetted value to get FUSE(0–4), and let FUSE(0–4) to be outputted to fine tuner 2. Fine tuner 2 will get a new P value according to PROGRAM and FUSE(0–4), so as to obtain a more accurate frequency. PROGRAM and FUSE(0–4) will burn out related poly fuses on IC poly layer. In FIG. 3(c), R0 . . . R4 are poly fuses.

Fine tuner 2 is designed so that all fuses are initially unburned. As the frequency is fine tuning, at least one fuse will be burned out according to FUSE(0–4). After fuses have been burned, fine tuner 2 will be closed forever in order to avoid the next programming of the fuses.

Therefore, an accurate frequency will be obtained with only one adjustment according to the present invention. Furthermore, in an infrared transmitter IC, since a big current in an IR diode during remote signal transmitting will cause a transient voltage drop, and this will make Vcc vary, and result in an unstable frequency. While the reference voltage generator 1 of the present invention has the function of voltage regulation, Vref will not vary with Vcc, thus the frequency is maintained to be very stable.

In addition, the battery in an infrared transmitter will decrease somewhat for example from 3.3 volt to 3.1 volt after several months of use, while Vref of the reference voltage generator 1 according to the present invention is very stable. Also since period T=RC/P, T is not influenced by Vcc or even Vref, and so is the frequency.

The function of RESET signal is to set the initial states of all the circuits related to timing, when the device is enabled.

The ENABLE signal can make oscillator 3 stop oscillating when the device is in an idle state; and will enable oscillator 3 to oscillate when the device is to operate.

It is no doubt that after reading the above descriptions any skillful person in the art can create many different variations without departing the spirit and scope of the accompanying claims. Therefore, it is intended that the appended claims will cover all those variations.

I claim:

1. A method for adjusting the frequency of an oscillator built in an integrated circuit, comprising the steps of:
   (a) a stable reference voltage Vref is generated by a reference voltage generator, and then divided into ½Vref and ¾Vref for outputting;
   (b) said reference voltage Vref is inputted into a fine tuner to generate a voltage PVref for outputting, wherein P is a positive number;
   (c) a charging/discharging oscillator is inputted with said PVref, Vref, ½Vref, ¾Vref to generate a square wave, the frequency of said square wave is controlled by a resistor and a capacitor in said oscillator;
   (d) a timing reference clock and said square wave are inputted into a frequency counter to count out a frequency value of said square wave, and generate a PROGRAM signal;
   (e) said frequency value of said square wave is inputted into a comparator to compare with a preset value, so as to generate a relative value FUSE(0–n);
   (f) said PROGRAM signal and said FUSE(0–n) are inputted into said fine tuner, said FUSE(0–n) will burn out related fuses in said fine tuner to get a new P value, so that said oscillator will generate an accurate frequency according to said new P value.

2. A device for adjusting the frequency of an oscillator built in an integrated circuit, comprising the following circuits:
   a reference voltage generator for generating a stable reference voltage Vref, 1/2Vref, and 3/4Vref;
   a fine tuner for receiving a reset signal and said stable reference voltage Vref, and generate a voltage of PVref, wherein P is a positive number;
   a charging/discharging oscillator for receiving an enable signal, said PVref, Vref, 1/2Vref, 3/4Vref to generate a square wave, a resistor and a capacitor in said oscillator is used to control the frequency of said square wave;

a frequency counter for receiving said reset signal, a timing reference clock and said square wave to count a frequency value of said square wave for outputting, and output a PROGRAM signal to said fine tuner;

a comparator for comparing said frequency value with a preset value and generate a relative value FUSE(0–n) for outputting to said fine tuner;

said FUSE(0–n) will burn out related fuses in said fine tuner, so that said fine tuner will generate a new P value, and said oscillator will obtain an accurate frequency.

3. The method for adjusting the frequency of an oscillator built in an integrated circuit according to claim 1, wherein 0<P<1.

4. The method for adjusting the frequency of an oscillator built in an integrated circuit according to claim 1, wherein said comparator is a ROM having an internal table.

5. The method for adjusting the frequency of an oscillator built in an integrated circuit according to claim 1, wherein said relative value FUSE(0–n) is digital signal of n+1 bits.

6. The method for adjusting the frequency of an oscillator built in an integrated circuit according to claim 1, wherein said resistor (with resistance R) and said capacitor (with capacitance C) in said oscillator is used for charging and discharging, with a period of T, T=RC/P, since R, C are constants, by adjusting said P value, an accurate T value can be obtained, and so an accurate frequency.

7. The method for adjusting the frequency of an oscillator built in an integrated circuit according to claim 1, wherein said fuses are poly fuses formed in a poly layer of IC.

8. The method for adjusting the frequency of an oscillator built in an integrated circuit according to claim 1, wherein said fuses can be replaced by other equivalent devices or circuits.

9. The method for adjusting the frequency of an oscillator built in an integrated circuit according to claim 1, wherein said n value in said FUSE(0–n) is increasing with the desired accuracy of the frequency.

10. The device for adjusting the frequency of an oscillator built in an integrated circuit according to claim 2, wherein said enable signal can make said oscillator stop oscillating when said device is in an idle mode, and make said oscillator oscillate when said device is to operate.

11. The device for adjusting the frequency of an oscillator built in an integrated circuit according to claim 2, wherein 0<P<1.

12. The device for adjusting the frequency of an oscillator built in an integrated circuit according to claim 2, wherein said comparator is a ROM having an internal table.

13. The device for adjusting the frequency of an oscillator built in an integrated circuit according to claim 2, wherein said relative value FUSE(0–n) is a digital signal of n+1 bits.

14. The device for adjusting the frequency of an oscillator built in an integrated circuit according to claim 2, wherein said resistor (with resistance R) and said capacitor (with capacitance C) in said oscillator is used for charging and discharging, with a period of T, T=RC/P, since R, C are constants, by adjusting said P value, an accurate T value can be obtained, and so an accurate frequency.

15. The device for adjusting the frequency of an oscillator built in an integrated circuit according to claim 2, wherein said fuses are poly fuses formed in a poly layer of IC.

16. The device for adjusting the frequency of an oscillator built in an integrated circuit according to claim 2, wherein said fuses can be replaced by other equivalent devices or circuits.

17. The device for adjusting the frequency of an oscillator built in an integrated circuit according to claim 2, wherein said n value in said FUSE(0–n) is increasing with the desired accuracy of the frequency.

* * * * *